(12) United States Patent
Symanczyk

(10) Patent No.: US 7,106,614 B2
(45) Date of Patent: Sep. 12, 2006

(54) MEMORY CIRCUIT AND METHOD FOR PROVIDING AN ITEM OF INFORMATION FOR A PRESCRIBED PERIOD OF TIME

(75) Inventor: Ralf Symanczyk, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/109,583

(22) Filed: Apr. 19, 2005

(65) Prior Publication Data

US 2005/0243633 A1 Nov. 3, 2005

(30) Foreign Application Priority Data

Apr. 19, 2004 (DE) .................. 10 2004 018 859

(51) Int. Cl.
*G11C 11/00* (2006.01)
(52) U.S. Cl. ...................................... 365/140; 365/100
(58) Field of Classification Search ................ 365/148, 365/100, 113, 163
See application file for complete search history.

(56) References Cited

U.S. PATENT DOCUMENTS

| 5,400,267 | A | 3/1995 | Denen et al. |
| 6,011,772 | A | 1/2000 | Rollhaus et al. |
| 6,487,106 | B1 | 11/2002 | Kozicki |
| 6,709,802 | B1 | 3/2004 | Lawandy et al. |
| 6,888,773 | B1 * | 5/2005 | Morimoto .................. 365/218 |
| 6,891,749 | B1 * | 5/2005 | Campbell et al. ........... 365/163 |
| 6,954,385 | B1 * | 10/2005 | Casper et al. .......... 365/189.07 |
| 2003/0003394 | A1 | 1/2003 | Lawandy et al. |
| 2003/0035315 | A1 | 2/2003 | Kozicki |
| 2003/0213710 | A1 | 11/2003 | Thompson et al. |
| 2004/0044841 | A1 | 3/2004 | Gilton |
| 2005/0243596 | A1 * | 11/2005 | Symanczyk .................. 365/153 |
| 2006/0002174 | A1 * | 1/2006 | Hosoi et al. ................. 365/148 |
| 2006/0044878 | A1 * | 3/2006 | Perner .................... 365/189.01 |

FOREIGN PATENT DOCUMENTS

| WO | WO 02/058056 A1 | 7/2002 |
| WO | WO 02/082452 A2 | 10/2002 |
| WO | WO 02/099470 A2 | 12/2002 |
| WO | WO 03/032392 A2 | 4/2003 |
| WO | WO 03/097488 A1 | 11/2003 |

OTHER PUBLICATIONS

German Patent Office Examination Report dated Sep. 29, 2004.
German Patent Office Examination Report dated Mar. 1, 2005.
M.N. Kozicki, M. Yun, L. Hilt, and A. Singh, *Application Of Programmable Resistance Changes in Metal-Doped Chalcogenides*, Electromechanical Society Proc., vol. 99-13, pp. 298-309 (1999).

* cited by examiner

Primary Examiner—Anh Phung
(74) *Attorney, Agent, or Firm*—Patterson & Sheridan, L.L.P.

(57) ABSTRACT

The invention relates to a memory circuit for providing an item of information for a prescribed period of time. The memory circuit has a memory cell with a PMC resistance component which has a solid electrolyte material and a write circuit for writing to the memory cell by applying an electrical variable to the solid electrolyte material. The write circuit is configured to set a resistance of the PMC resistance component on the basis of the prescribed period of time. The resistance corresponds to a logic state of the memory cell and increases over time such that the resistance reaches or exceeds a prescribed resistance threshold value in the prescribed period of time.

20 Claims, 2 Drawing Sheets

- ■ I (Write) = 30 μA
- ◆ I (Write) = 2 μA
- ▲ I (Write) = 0.6 μA

MEMORY CIRCUIT AND METHOD FOR PROVIDING AN ITEM OF INFORMATION FOR A PRESCRIBED PERIOD OF TIME

CROSS-REFERENCE TO RELATED APPLICATIONS

This application claims foreign priority benefits under 35 U.S.C. §119 to co-pending German patent application number DE 10 2004 018 859.9, filed 19 Apr. 2004. This related patent application is herein incorporated by reference in its entirety.

BACKGROUND OF THE INVENTION

1. Field of the Invention

The invention relates to a memory circuit and a method for providing an item of information for a prescribed period of time.

2. Description of the Related Art

Memory circuits are generally designed in such a manner that they store an item of information for a period of time for as long as possible or a period at least longer than the lifetime of the memory circuit. In some applications, it may be expedient to provide memory circuits which store information only for a limited period of time.

Memory circuits which provide a particular item of stored information only for a prescribed period of time may be used in many fields. Such memory circuits may advantageously be used to store video or music data, particularly when lending video films or pieces of music for temporally limited use. The memory circuit is able to set the loan period in such a manner that the video or music data are available for reading only for the prescribed period of time corresponding to the loan period. It is thus no longer necessary to return a carrier medium for the video or music data after the loan period has expired.

There are also a multiplicity of fields in which temporally limited access of persons to a secure area must be ensured. In these cases, such limited access can also be implemented by means of an access device having a memory circuit (which stores an item of access information only for a prescribed period of time) without possible circumventory ways of extending the period of time. In addition, such memory circuits may also be provided for the purpose of storing personal data when data protection provisions stipulate that the storage of personal data is temporally restricted.

Previously, when lending video films or music files, suitable data storage media may be provided with a color layer which destroys itself after a few days and prevents the stored data from continuing to be read, for example from the company Flexplay. However, these are disposable products, and the data storage medium cannot be re-used once the loan period has expired and must be disposed of.

U.S. Pat. No. 6,487,106 B1 describes a memory cell having a programmable metallization cell (PMC) resistance element. The PMC resistance element is written to by means of a voltage above a threshold value in order to store an item of information in the memory cell in a nonvolatile manner, so that there is no need for a refresh means.

The document by M. N. Kozicki, M. Yun, L. Hilt, and A. Singh, entitled "Application of Programmable Resistance Changes in Metal-Doped Chalcogenides", (Electrochemical Society Proc., Vol. 99-13 (1999) 298) discloses the physical and electrical properties of a solid electrolyte material for a PMC resistance component which can be used in a memory cell. This document describes that the solid electrolyte material can assume various resistance states depending on the thickness of the solid electrolyte material and depending on the electrical parameters applied.

SUMMARY OF THE INVENTION

One aspect of the invention provides a memory circuit in which information is stored only for a prescribed period of time. Another aspect of the invention provides a method for providing an item of information in a memory cell in a temporally limited manner.

One embodiment of the present invention provides a memory circuit for providing an item of information for a prescribed period of time. The memory circuit has a memory cell with a PMC resistance component which contains a solid electrolyte material. The memory circuit further comprises a write circuit for writing to the memory cell by applying an electrical variable to the solid electrolyte material. The write circuit is configured to set a resistance in the PMC resistance component on the basis of the prescribed period of time. The resistance corresponds to a logic state of the memory cell and increases over time such that the resistance reaches or exceeds a prescribed resistance threshold value during the prescribed period of time.

Another embodiment of the present invention provides a method for providing an item of information in a memory cell for a prescribed period of time. The memory cell has a PMC resistance component which contains a solid electrolyte material. An electrical variable is applied to the memory cell to set a logic state in the solid electrolyte material. A resistance is set in the PMC resistance component by applying the electrical variable which is selected on the basis of the prescribed period of time. The resistance to be set is selected in such a manner that the resistance increases over a period of time and reaches or exceeds a prescribed resistance threshold value in the prescribed period of time.

Another embodiment of the present invention provides a memory device for providing information in an array of memory cells for a prescribed period of time. The memory device comprises a memory circuit and a data interface. The memory circuit comprises the array of memory cells, a write circuit, a read circuit and an address decoding circuit. Each memory cell has a PMC resistance component which contains a solid electrolyte material. The PMC resistance component has a resistance which corresponds to a logic state of the memory cell. The resistance increases over time and reaches or exceeds a prescribed resistance threshold value during the prescribed period of time.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
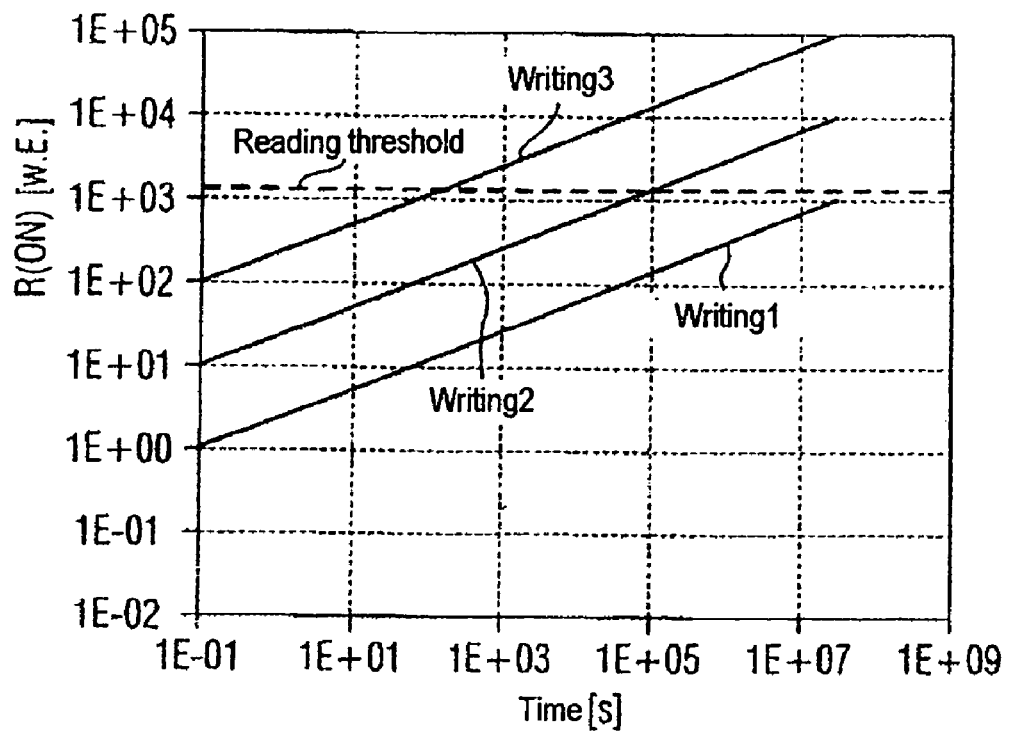
FIG. 1 schematically shows the degradation of the resistance of a PMC element on the basis of the parameters during the write operation.

One embodiment of the present invention provides a memory circuit for providing an item of information for a prescribed period of time. The memory circuit has a memory cell with a PMC resistance component which contains a solid electrolyte material. The memory circuit further comprises a write circuit for writing to the memory cell by applying an electrical variable to the solid electrolyte material. The write circuit is configured to set a resistance in the PMC resistance component on the basis of the prescribed period of time. The resistance corresponds to a logic state of the memory cell and increases over time such that the resistance reaches or exceeds a prescribed resistance threshold value during the prescribed period of time.

A PMC resistance component forms an electrically conductive path in its solid electrolyte when an electrical field of a particular direction is applied and destroys this electrically conductive path when an opposite electrical field is applied. Embodiments of the invention are based on the observation that the resistance of the PMC resistance component may be more stable or less stable, depending on the magnitude of the conductive path formed, over time after the electrical field has been applied. If the electrically conductive path is relatively small, the electrically conductive path disappears over a particular short period of time. The period of time may be between minutes and years depending on the length of time for which and/or the extent to which the electrical field for writing to the PMC resistance component has been applied. If the electrically conductive path is sufficiently large, the electrically conductive path may remain relatively stable and does not degrade (or does not degrade substantially) during the lifetime of the PMC resistance component.

According to one aspect of the invention, the electrical field may be applied to the PMC resistance component on the basis of a desired period of time. In one embodiment, the desired period of time corresponds to the prescribed period of time during which the memory circuit is intended to store the information. Once the memory circuit has been programmed, a user of such a memory circuit may use the information contained therein in any desired manner or in the manner prescribed by using the memory circuit within the prescribed period of time. After the period of time has elapsed, the information disappears (e.g., deleted or erased) from the memory circuit and the user can no longer access the information because the data are automatically deleted after the time has elapsed.

The resistance threshold value may be selected such that, when the resistance threshold value is reached or exceeded, an item of information, which is determined by a resistance (e.g., a resistance of a memory element) and is stored in the memory cell, may no longer be read or accessed. This ensures that the information is no longer reliably available after the prescribed period of time.

The write circuit may be configured to apply the electrical variable to the memory cell for a programming period to write to the memory cell and set the appropriate resistance in the PMC resistance component. The magnitude of the electrically conductive path of the PMC resistance component is primarily determined by the following three parameters: period of time during which the electrical field is applied, current flow through the element and voltage across the element during the write operation. The write circuit may contain a look-up table memory which assigns the prescribed period of time to the parameters of the write operation.

The memory circuit may have a read circuit to detect a first state of the memory cell when the resistance is below the resistance threshold value and to detect a second state when the resistance is above the resistance threshold value.

The memory circuit according to embodiments of the invention has a PMC resistance component which comprises a solid electrolyte material. A solid electrolyte material has a chalcogenide material, for example, GeSe, on which a first electrode, for example, a silver electrode (anode), and a second, inert electrode (cathode) are arranged. When a high electrical field of one direction is applied to the electrodes, silver ions move from the silver anode into the chalcogenide material. When the electrical field is of the opposite direction, silver ions move back to the silver anode. When the silver ions migrate into the electrolyte material from the silver anode, electrically conductive regions are formed between the silver anode and the inert cathode, causing the conductivity between the anode and the cathode to increase and the electrical resistance by the solid electrolyte material to decrease. The magnitude of the electrical field or the current flow through the element and the period of time for which the electrical field is applied to the solid electrolyte material determine the concentration of silver ions (which form the conductive path) in the region deposited in the solid electrolyte material.

The higher the concentration of silver ions included in a prescribed region of the solid electrolyte material, the more stable is the electrically conductive path formed in the solid electrolyte material during a period of time.

The solid electrolyte material is not restricted to GeSe, but rather may also be formed from other chalcogenide materials. Instead of a silver electrode, an electrode of another conductive material may be provided. The conductive material, in the form of ions, may migrate through the selected chalcogenide material when an electrical field is applied.

Figure 1A:
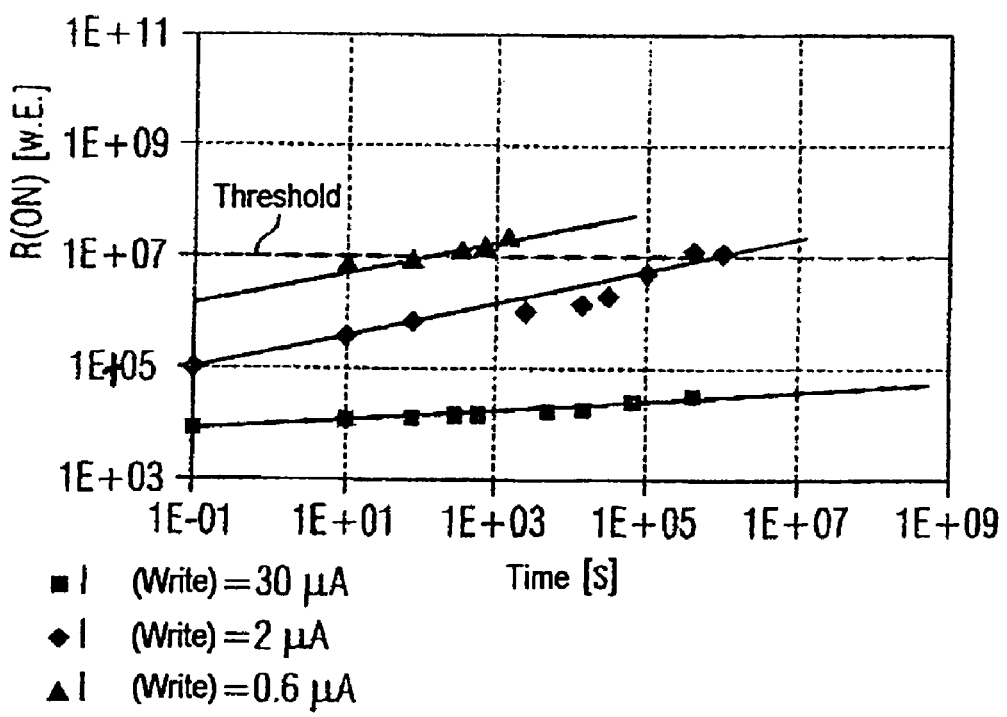
FIG. 1A is a graph showing the degradation of the resistance of the PMC component on the basis of the write current using measured values.

FIG. 1 schematically shows, for various writing parameters (Writing1, Writing2 and Writing3), the profiles of the resistance over time of a PMC element after the end of the write operations. The parameters (or electrical variables) which determine the write operations may include the writing period, the current flow through the PMC element and the voltage across the element during writing. FIG. 1a uses measurement data from an exemplary PMC element to show this behavior. In this example, the current flow through the element was selected as the variable parameter.

As shown in FIG. 1A, for a write current of 30 µA, a resistance of approximately 10 kΩ is provided. The resistance remains relatively stable (i.e., between 10 kΩ and 100 kΩ) over a long period of time. The conductive path in the solid electrolyte material degrades only to a very small extent or does not degrade at all, with the result that the resistance by the PMC resistance component does not change substantially.

For write currents of 2 µA and 0.6 µA, the electrical resistance increases over time to the extent that the electrically conductive path through the solid electrolyte material is removed (i.e., the resistance increases above a threshold value). When other write currents are selected, correspondingly changed periods of time may be realized.

A memory cell constructed with the PMC resistance component is in a first logic state when the resistance of the PMC component is below a resistance threshold and in a second logic state when the resistance of the PMC component is above such a resistance threshold. In the graph shown in FIG. 1A, such a resistance threshold is shown in the form of a dashed line at 10 MΩ. In the case of a memory cell which has been written to using a write current of 2 µA, this resistance threshold value is reached after approximately six days. In the case of a memory cell which has been written to using a write current of 0.6 µA, the resistance threshold is reached as early as after a few minutes. When other writing currents are selected, correspondingly changed periods of time may be realized.

In one embodiment, by way of example, a memory cell whose PMC resistance component has a resistance of less than the threshold resistance value (e.g., 10 MΩ) stores a "logic 1", whereas a memory cell whose PMC resistance component has a resistance of greater than 10 MΩ stores a "logic 0".

Figure 2:
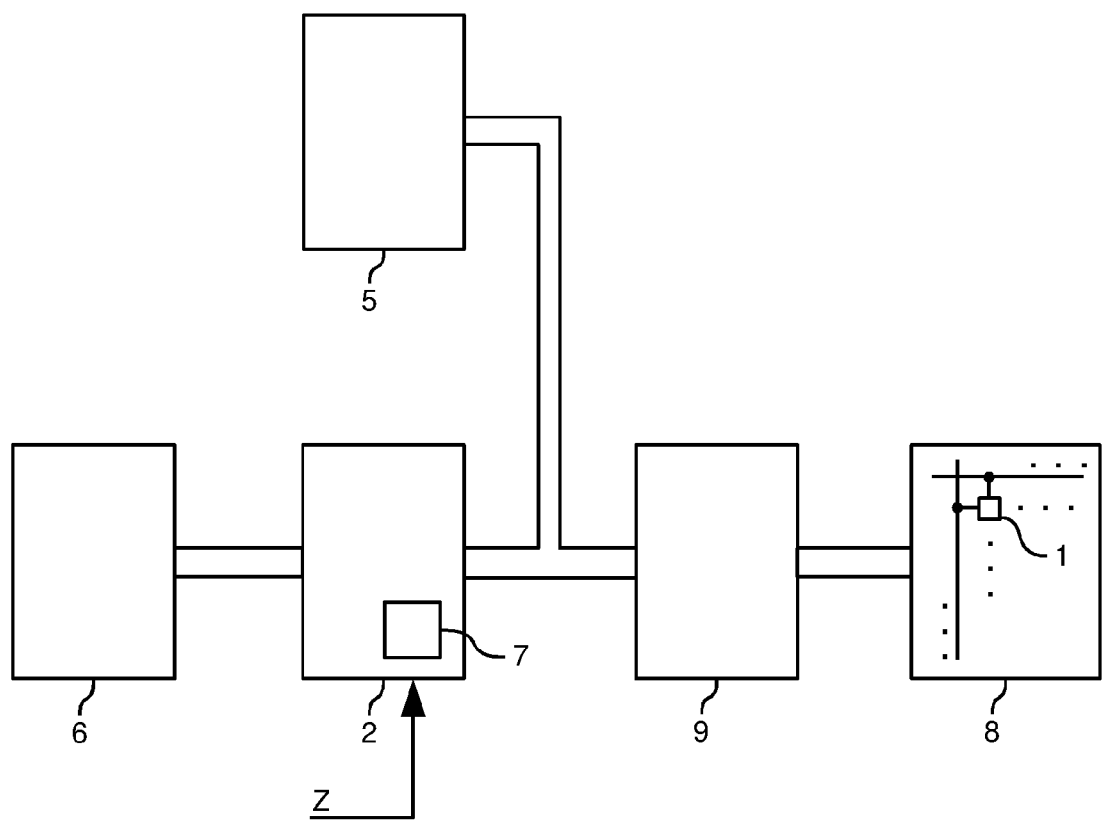
FIG. 2 is a diagram showing parts of a memory circuit according to one embodiment of the invention.
Figure 2A:
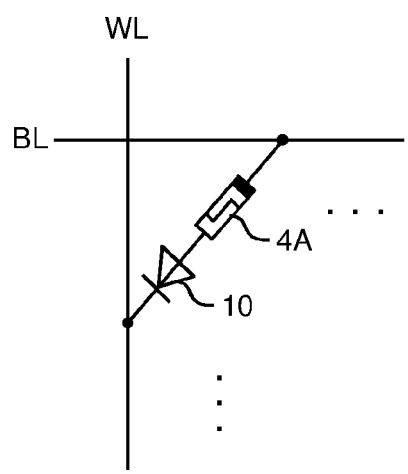
FIG. 2A is a schematic diagram showing one implementation of a memory cell.
Figure 2B:
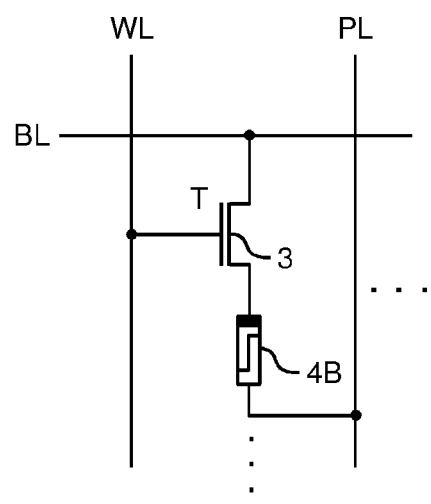
FIG. 2B is a schematic diagram showing another implementation of a memory cell.

FIG. 2 shows parts of a memory circuit according to one embodiment of the invention having a memory cell 1 in a memory cell array 8 and a write circuit 2 which writes to the memory cell array 8 using an address decoding circuit 9. FIGS. 2A and 2B show embodiments of implementations of the memory cells 1 of the memory cell array 8. FIG. 2A shows a so-called crosspoint architecture having an optional selection diode 10 connected in series with a PMC resistance element 4A which is located at a crossover point between a bit line BL and a word line WL and is electrically connected to these lines. In FIG. 2B, the memory cell has a switching element 3 (e.g., in the form of a field effect transistor) which is coupled to a PMC resistance component 4B in such a manner that, when the switching element 3 is activated (switched through), the resistance component may be written to using a write current that flows through the switching element 3 or can be read using a read current that flows through the switching element 3. The memory cell 1 is connected to a word line WL and to a bit line BL, and in one embodiment, a drain connection of the switching element 3 (which is in the form of a field effect transistor) is connected to the bit line while a gate connection of the field effect transistor is connected to the word line. A source connection of the field effect transistor is connected to a first connection of the PMC resistance component 4, and a second connection of the PMC resistance component 4 is connected to a defined potential, for example, a ground potential.

The memory cell 1 may be programmed by activating the word line with the memory cell to be programmed so that the switching element 3 is switched on (or activated). The write circuit 2 applies a write current to the relevant bit line (e.g., utilizing a current source), resulting in the write current flowing through the PMC resistance component 4 and, on account of the forward resistance, giving rise to an electrical field there, with the result that an electrically conductive path is formed (or alternatively, destroyed, depending on the electrical bias).

When reading an item of information from the memory cell, the switching device 3 is likewise activated by the relevant word line, and the electrical resistance of the PMC resistance component is determined by applying a voltage and measuring the resultant current and is correspondingly assigned to a "logic 0" or "logic 1". In one embodiment, the read operation is effected by means of a read circuit 5 which is likewise connected to the bit line BL.

The write circuit 2 is connected to a data interface 6 which controls communication between a terminal and the memory circuit. Such a terminal may be, for example, a film or music playback device, which may be utilized to transfer the video or audio data to or from the memory cells 1. The data interface 6 may also be configured to communicate with a security system or communicate security data, such as, for example, access data, encryption data or the like stored in the memory cells.

The write circuit 2 also has an input for receiving a period data item Z which specifies the time after which the information that has been written to the memory cell 1 is no longer accessible or readable. If permanent information is to be written to the memory cell array 8, this can likewise be specified by the period data item Z. The period data item Z may be changed depending on the respective write operation to the memory cell, and thus the memory circuit may store permanent data (i.e., information which is permanently available) and temporary data (data which expires in a prescribed time period) in respective memory cells.

Expiry of the information applies only to that part of the information for which the memory cell is written to in such a manner that the resistance of the PMC resistance component is below the resistance threshold. In such instances, an electrically conductive path (which can degrade) is formed in the solid electrolyte. Since video data and music data generally have a very large number of "logic 0" and "logic 1" data, there are always memory cells whose PMC resistance components have a resistance that is below the resistance threshold value, with the result that the contained information can degrade.

The period data item Z specifies the time in which it is to be no longer possible to read the information stored in the memory cell. The period data item Z is assigned, in the write circuit 2, to programming parameters which specify which write current is to be used to write to the PMC resistance component and for which programming period of the application of the write current the PMC resistance component is to be written to. The write current and the period of writing (i.e., the duration of applying the write current) to the memory cell determine the period of time after which the information in the memory cell is to be deleted. The write circuit 2 may have a memory having an assignment table (look-up table) 7 which assigns the programming parameters to the period data item Z (which specifies the prescribed period of time) so that the memory cell is written to in accordance with the programming parameters in the write circuit 2.

The memory circuit according to one embodiment of the invention may be implemented in integrated fashion by combining CMOS logic circuits with the appropriate drive system (e.g., FEOL (Front End of Line)) and with a PMC cell array which switches resistively and is in the form of a crosspoint structure or 1R1T cell array (e.g., BEOL (Back End of Line)).

While the foregoing is directed to embodiments of the present invention, other and further embodiments of the invention may be devised without departing from the basic scope thereof, and the scope thereof is determined by the claims that follow.

What is claimed is:

1. A memory circuit for providing an item of information for a prescribed period of time, comprising:
    a memory cell having a programmable metallization cell (PMC) resistance component, wherein the PMC resistance component has a solid electrolyte material and a resistance corresponding to a logic state of the memory cell, wherein the resistance increases over time; and a write circuit for writing to the memory cell by applying an electrical variable to the solid electrolyte material, wherein the write circuit is configured to set the resistance in the PMC resistance component based on the prescribed period of time such that the resistance reaches a prescribed resistance threshold value in about the prescribed period of time.

2. The memory circuit of claim 1, wherein the electrical variable is applied to the solid electrolyte material such that an electrically conductive path forms in the solid electrolyte material.

3. The memory circuit of claim 1, wherein the write circuit is configured to apply the electrical variable to the solid electrolyte for a programming duration for writing to the memory cell to set the resistance of the PMC resistance component.

4. The memory circuit of claim 1, wherein the write circuit contains a look-up table memory which assigns the electrical variable corresponding to the prescribed period of time.

5. The memory circuit of claim 1, wherein the prescribed resistance threshold value is selected such that, when the resistance threshold value is reached, information stored in the memory cell is no longer readable.

6. The memory circuit of claim 1, further comprising:
a read circuit configured to detect a first state of the memory cell when the resistance is below the resistance threshold value and to detect a second state when the resistance is above the resistance threshold value.

7. The memory circuit of claim 1, wherein the write circuit includes an input for receiving information regarding the prescribed period of time.

8. The memory circuit of claim 7, wherein the memory circuit comprises a plurality of memory cells and wherein each memory cell is programmable according to a respective prescribed period of time.

9. The memory circuit of claim 1, wherein the memory cell comprises a diode connected in series with the PMC resistance element, the memory cell disposed between a word line and a bit line of the memory circuit.

10. The memory circuit of claim 1, wherein the memory cell comprises a switching element coupled to the PMC resistance element, wherein the switching element is connected to a word line for selective activation of the switching element, and wherein the switching element, when activated, connects the PMC resistance element to a bit line of the memory circuit.

11. A method for providing an item of information in a memory cell for a prescribed period of time, comprising:
providing a programmable metallization cell (PMC) resistance component in the memory cell, wherein the PMC resistance component comprises a solid electrolyte material and has a resistance corresponding to a logic state of the memory cell, wherein the resistance increases over time;
prescribing a threshold resistance value for determining the logic state of the memory cell;
determining an electrical variable according to the prescribed period of time; and
writing to the memory cell by applying the electrical variable to the solid electrolyte material to set the resistance such that the resistance reaches the threshold resistance value in about the prescribed period of time.

12. The method of claim 11, wherein the threshold resistance value is selected such that when the resistance threshold value is reached, information stored in the memory cell is no longer readable.

13. The method of claim 11, further comprising:
wherein the electrical variable is determined by selecting one or more parameters from a look-up table stored in memory, wherein the one or more parameters correspond to the prescribed period of time and include at least a programming duration for applying a writing current to the memory cell.

14. The method of claim 13, further comprising:
receiving an input for a duration data corresponding to the prescribed period of time.

15. The method of claim 11, further comprising:
detecting a first logic state of the memory cell when the resistance is below the threshold resistance value; and
detecting a second logic state of the memory cell when the resistance is above the threshold resistance value.

16. An electronic device for providing information for a prescribed period of time, comprising:
a memory circuit comprising:
an array of memory cells, wherein each of the memory cell includes a programmable metallization cell (PMC) resistance component having a solid electrolyte material, the PMC resistance component having a respective resistance that increases over time, each memory cell having a first logic state when the respective resistance is below a threshold resistance value and a second logic state when the respective resistance is above the resistance threshold value;
an address decoding circuit configured to access the memory cells;
a write circuit for writing to the memory cells, wherein each memory cell is written by applying an electrical variable to the solid electrolyte material to set the resistance such that the resistance reaches a prescribed resistance threshold value in about the prescribed period of time; and
a read circuit for reading logic states of the memory cells; and
a data interface for controlling communication with the memory circuit.

17. The electronic device of claim 16, wherein the write circuit is configured to apply the respective electrical variable to the respective solid electrolyte material for a respective programming duration, and wherein the write circuit includes a look-up table memory which assigns one or more parameters of the electrical variable corresponding to the prescribed period of time, wherein the one or more parameters includes at least the programming duration.

18. The electronic device of claim 17, wherein the write circuit has an input of the prescribed period.

19. The electronic device of claim 18, wherein the array of memory cells stores both temporary data which is accessible in a first prescribed period of time and permanent data which is accessible beyond the first prescribed period of time.

20. The electronic device of claim 16, wherein the resistance threshold value is selected such that when the resistance reaches the threshold resistance value, the memory cell is no longer readable.

* * * * *